(12) United States Patent
Wang

(10) Patent No.: US 11,616,145 B2
(45) Date of Patent: Mar. 28, 2023

(54) FINFET STACK GATE MEMORY AND METHOD OF FORMING THEREOF

(71) Applicant: Integrated Silicon Solution Inc., Milpitas, CA (US)

(72) Inventor: Hsingya Arthur Wang, Milpitas, CA (US)

(73) Assignee: INTEGRATED SILICON SOLUTION INC., Milpitas, CA (US)

( * ) Notice: Subject to any disclaimer, the term of this patent is extended or adjusted under 35 U.S.C. 154(b) by 0 days.

(21) Appl. No.: 17/563,214

(22) Filed: Dec. 28, 2021

(65) Prior Publication Data

US 2022/0123146 A1 Apr. 21, 2022

Related U.S. Application Data

(62) Division of application No. 16/815,151, filed on Mar. 11, 2020, now abandoned.

(60) Provisional application No. 62/933,588, filed on Nov. 11, 2019.

(51) Int. Cl.
| | |
|---|---|
| H01L 29/78 | (2006.01) |
| H01L 29/788 | (2006.01) |
| H01L 29/792 | (2006.01) |
| H01L 21/762 | (2006.01) |
| H01L 29/66 | (2006.01) |

(52) U.S. Cl.
CPC .... H01L 29/7851 (2013.01); H01L 21/76224 (2013.01); H01L 29/66795 (2013.01); H01L 29/66825 (2013.01); H01L 29/66833 (2013.01); H01L 29/788 (2013.01); H01L 29/792 (2013.01)

(58) Field of Classification Search
CPC .................................................. H01L 27/11519
See application file for complete search history.

(56) References Cited

U.S. PATENT DOCUMENTS

| | | | | |
|---|---|---|---|---|
| 2006/0220144 | A1* | 10/2006 | Anezaki | H01L 27/11519 257/E21.547 |
| 2007/0093020 | A1* | 4/2007 | Kim | H01L 27/115 438/243 |
| 2008/0081384 | A1* | 4/2008 | Oh | H01L 22/12 700/121 |
| 2014/0312410 | A1* | 10/2014 | Park | H01L 29/40117 257/325 |

(Continued)

FOREIGN PATENT DOCUMENTS

TW 201926653 A 7/2019

*Primary Examiner* — Peter Bradford
(74) *Attorney, Agent, or Firm* — McClure, Qualey & Rodack, LLP

(57) ABSTRACT

A method of forming a FinFET stack gate memory includes a nitride film forming step, a nitride film is formed on a memory cell area with a shallow trench isolation (STI) structure; a stripping step, a portion of the nitride film is stripped, the other portion of the nitride film is remained at the STI structure, and a STI oxide is disposed in the STI structure; a floating gate (FG) structure forming step, a tunnel oxide is disposed, and a first polysilicon is disposed to form a FG structure; an oxide-nitride-oxide (ONO) layer disposing step, a portion of the STI oxide is stripped, and an ONO layer is disposed; a removing step, a portion of the ONO layer is removed; a control gate (CG) structure forming step, a portion of the FG structure is removed, and a second polysilicon is disposed to form a CG structure.

9 Claims, 8 Drawing Sheets

(56) References Cited

U.S. PATENT DOCUMENTS

2018/0197789 A1   7/2018  Glass et al.
2019/0035633 A1   1/2019  Jha et al.
2019/0165115 A1   5/2019  Lin et al.

* cited by examiner

FINFET STACK GATE MEMORY AND METHOD OF FORMING THEREOF

RELATED APPLICATIONS

The present application is a divisional application of the application Ser. No. 16/815,151, filed Mar. 11, 2020, now abandoned, which claims priority to U.S. Provisional Application Ser. No. 62/933,588, filed Nov. 11, 2019, which is herein incorporated by reference.

BACKGROUND

Technical Field

The present disclosure relates to a stack gate memory and a method of forming thereof. More particularly, the present disclosure relates to a FINFET stack gate memory and a method of forming thereof.

Description of Related Art

FIG. 8 is a schematic view of a structure of a stack gate memory 30 of prior art. In FIG. 8, a $SiO_2$ film 31 is grown on a p-type silicon wafer 32 in a furnace at 1000° C., and a thickness of the $SiO_2$ film 31 is about 200 Å. Then, masks and implants are applied to form a deep N-well, an N-well and a P-well. A silicon nitride ($Si_3N_4$) film 33 is deposited for about 2000 Å, a photo printing active area (AA) pattern is applied for transistors, and a stack of $Si_3N_4/SiO_2$/silicon is etched in sequence.

However, a channel length of the stack gate memory 30 of prior art scaling below 120 nm is a limitation, because a short channel effects including a memory cell punch-through and a hot carrier injection will be caused further scaling difficulty, and a significant current loss and a reliability issue will be happened. Moreover, a maximum current of the stack gate memory 30 is limited, because an effective channel width is less than 80 nm. There is a limitation of maximum current less than 20 μA, and it causes a difficulty of a read margin. That is, the read margin is small, and a product reliability is at risk. Therefore, a FINFET stack gate memory scaling below 120 nm with stable reliability needs to be developed.

SUMMARY

According to one aspect of the present disclosure, a method of forming a FinFET stack gate memory includes a nitride film forming step, a stripping step, a floating gate (FG) structure forming step, an oxide-nitride-oxide (ONO) layer disposing step, a removing step and a control gate (CG) structure forming step. In the nitride film forming step, a nitride film is formed on a memory cell area of a memory structure with a shallow trench isolation (STI) structure. In the stripping step, a portion of the nitride film is stripped, the other portion of the nitride film which is unstripped is below a surface of a substrate and is remained at a bottom of the STI structure, and a STI oxide is disposed in the STI structure. In the FG structure forming step, a tunnel oxide is disposed on the surface of the substrate and a surface of the other portion of the nitride film, and a first polysilicon is disposed on the tunnel oxide in the memory cell area and on the surface of the substrate in a non-memory cell area of the memory structure to form a FG structure. In the ONO layer disposing step, a portion of the STI oxide is stripped, and an ONO layer is disposed on a surface of the FG structure, the surface of the other portion of the nitride film, and a surface of the other portion of the STI oxide which is unstripped after a portion of the STI oxide is stripped in the memory cell area. In the removing step, a portion of the ONO layer is removed in the non-memory cell area of the memory structure. In the CG structure forming step, a portion of the FG structure is removed in the non-memory cell area of the memory structure, a second polysilicon is disposed on a surface of the ONO layer in the memory cell area and on the surface of the substrate and a surface of the STI oxide in the non-memory cell area of the memory structure to form a CG structure, and the FinFET stack gate memory is formed.

According to another aspect of the present disclosure, a FinFET stack gate memory includes a substrate, a shallow trench isolation (STI) structure and a memory cell area. A STI structure is disposed on the substrate, and includes a STI oxide. The STI oxide is disposed in the STI structure. The memory cell area includes a nitride film, a tunnel oxide, a floating gate (FG) structure, an oxide-nitride-oxide (ONO) layer and a control gate (CG) structure. The nitride film is disposed on a surface of the STI structure and below the surface of the substrate. The FG structure is disposed on the tunnel oxide. The ONO layer is disposed on the FG structure and the STI oxide, and the STI oxide is located between the ONO layer and the nitride film. The CG structure is disposed on the ONO layer, and the ONO layer is located between the FG structure and the CG structure.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1:
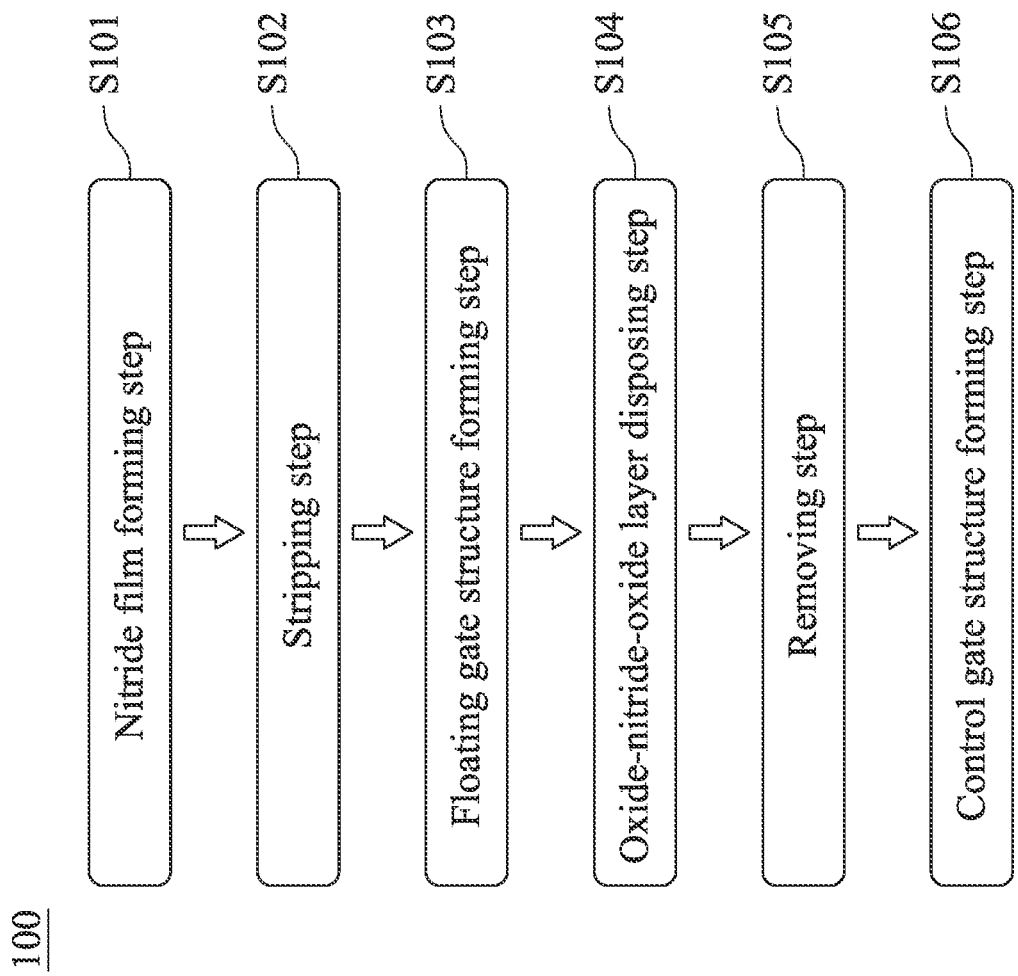
FIG. 1 is a step flow chart of a method of forming a FinFET stack gate memory according to an embodiment of the present disclosure.

FIG. 1 is a step flow chart of a method of forming a FinFET stack gate memory 100 according to an embodiment of the present disclosure. In FIG. 1, the method of forming the FinFET stack gate memory 100 includes a nitride film forming step S101, a stripping step S102, a floating gate (FG) structure forming step S103, an oxide-nitride-oxide (ONO) layer disposing step S104, a removing step S105 and a control gate (CG) structure forming step S106.

Figure 2:
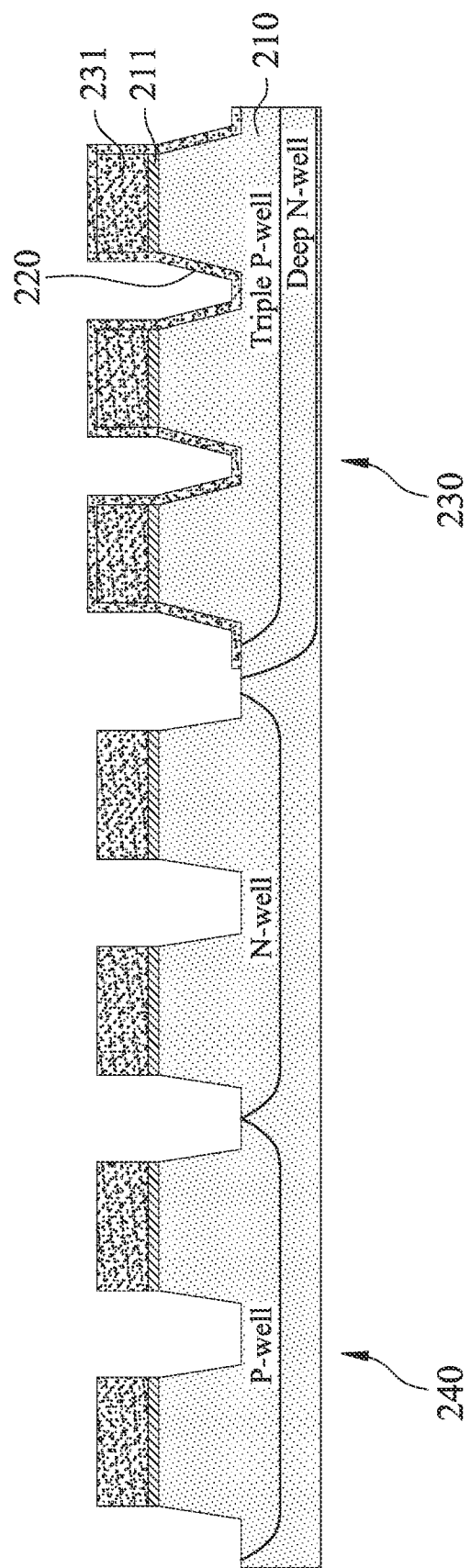
FIG. 2 is a schematic view of the nitride film forming step according to the embodiment of FIG. 1.

FIG. 2 is a schematic view of the nitride film forming step S101 according to the embodiment of FIG. 1. In FIGS. 1 and 2, a nitride film 231 is formed on a memory cell area 230 of a memory structure (its reference numeral is omitted) with a shallow trench isolation (STI) structure 220, and the nitride film 231 can be made of a silicon nitride, but is not limited thereto. Before the nitride film forming step S101, the STI structure 220 can be formed via an etching process, and a depth of the STI structure 220 can be 2000 Å. In detail, the nitride film 231 is formed on a thin oxide film 211, and the thin oxide film 211 is disposed on a substrate 210. The substrate 210 can be made of a silicon. Before the stripping step S102, the memory cell area 230 can be masked-off, and the nitride film 231 can be removed by an etching process in a non-memory cell area 240.

Figure 3:
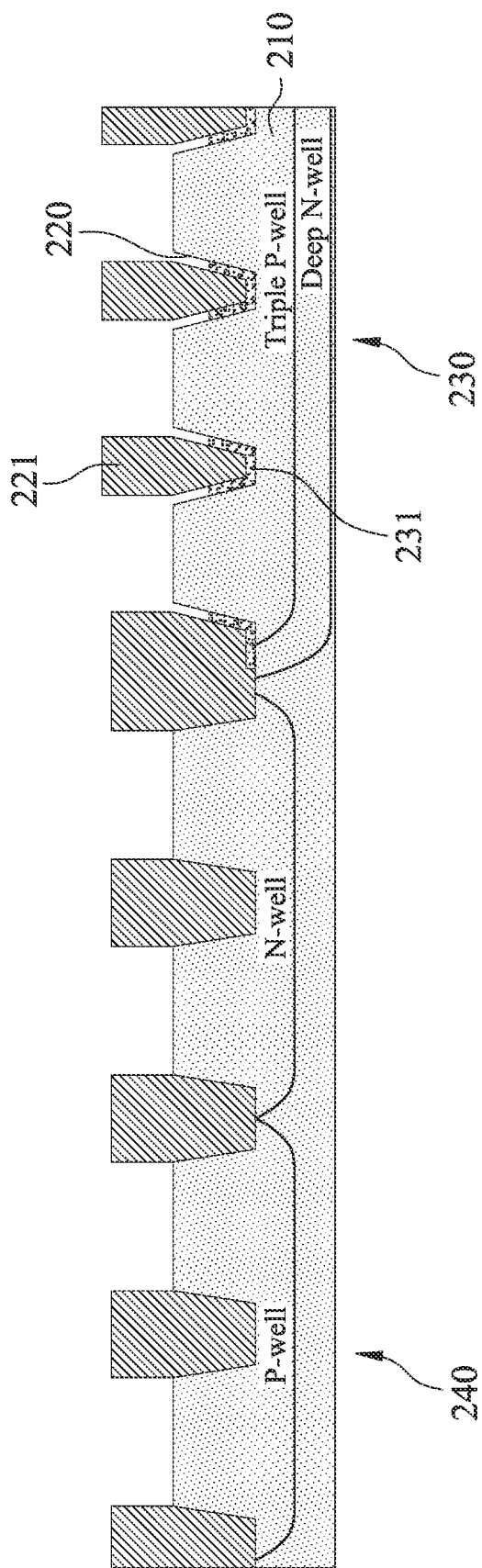
FIG. 3 is a schematic view of the stripping step according to the embodiment of FIG. 1.

FIG. 3 is a schematic view of the stripping step S102 according to the embodiment of FIG. 1. In FIGS. 1 and 3, a portion of the nitride film 231 is stripped, the other portion of the nitride film 231 which is unstripped is below a surface of the substrate 210 and is remained at a bottom of the STI structure 220, and a STI oxide 221 is disposed in the STI structure 220. Moreover, the portion of the nitride film 231 is stripped to 300 Å to 1400 Å, and a side-wall region is formed by the stripped portion of the nitride film 231 via a plasma etching. It is worth mentioning that every depth of each of the side-wall regions is similar. In detail, the STI oxide 221 can be disposed in the STI structure 220 via a process of chemical vapor deposition (CVD), and the STI oxide is performed via a chemical-mechanical polishing (CMP).

Figure 4:
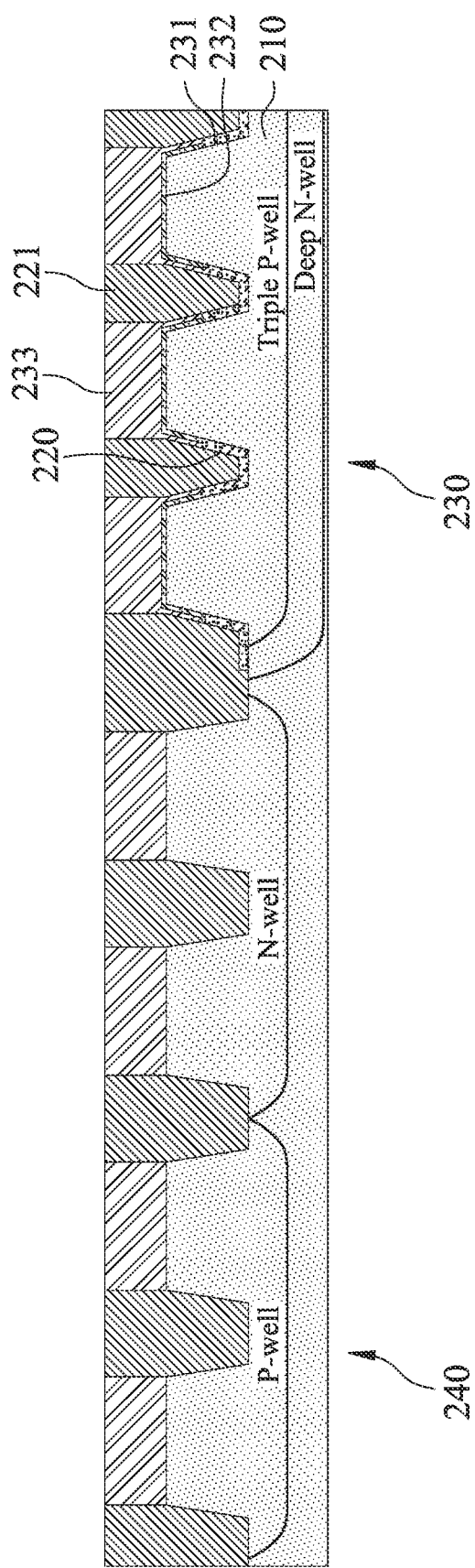
FIG. 4 is a schematic view of the FG structure forming step according to the embodiment of FIG. 1.

FIG. 4 is a schematic view of the FG structure forming step S103 according to the embodiment of FIG. 1. In FIGS. 1 and 4, a tunnel oxide 232 is disposed on the surface of the substrate 210 and a surface of the other portion of the nitride film 231, and a first polysilicon is disposed on the tunnel oxide 232 in the memory cell area 230 and on the surface of the substrate 210 in the non-memory cell area 240 of the memory structure to form a FG structure 233. In detail, the first polysilicon is disposed on the tunnel oxide 232 via a plasma process or the process of CVD at 300° C. to 800° C., and the FG structure 233 is performed via the CMP to form a FIN-shaped FG structure. The tunnel oxide 232 is disposed in the side-wall region formed in the stripping step S102, and it is favorable for increasing an effective memory cell channel width.

Figure 5:
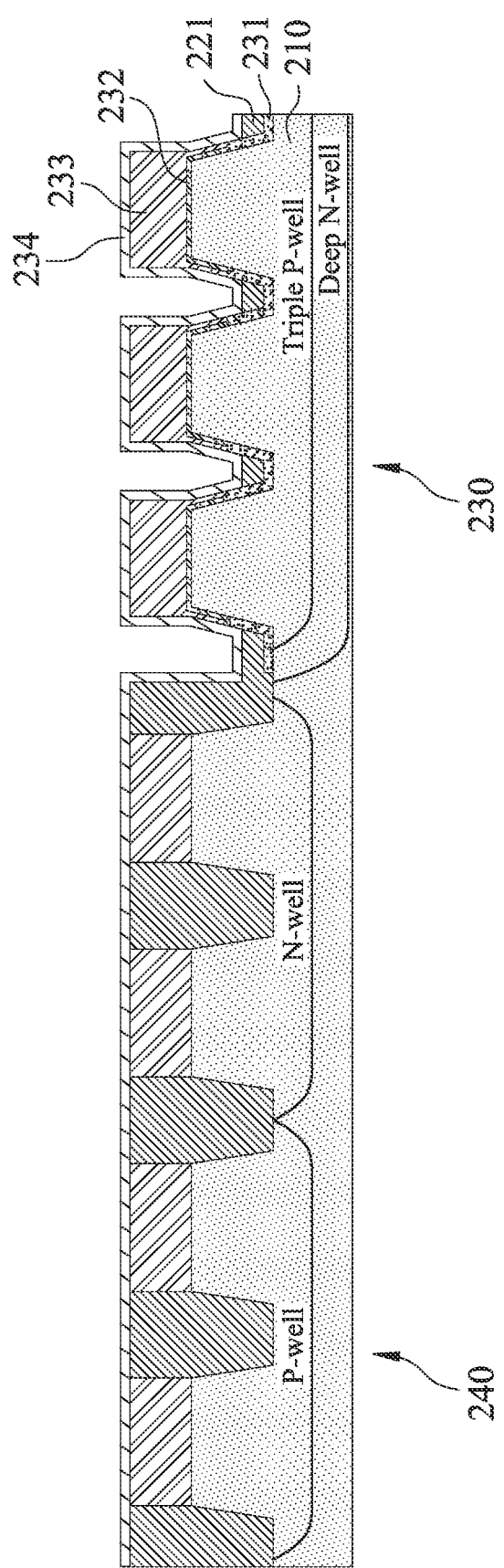
FIG. 5 is a schematic view of the ONO layer disposing step according to the embodiment of FIG. 1.

FIG. 5 is a schematic view of the ONO layer disposing step S104 according to the embodiment of FIG. 1. In FIGS. 1 and 5, a portion of the STI oxide 221 is stripped, and an ONO layer 234 is disposed on a surface of the FG structure 233, the surface of the other portion of the nitride film 231, and a surface of the other portion of the STI oxide 221 which is unstripped after a portion of the STI oxide 221 is stripped in the memory cell area 230. In detail, a mask is applied for stripping the portion of the STI oxide 221 in the memory cell area 230, and the portion of the STI oxide 221 is stripped via a solution containing a hydrofluoric acid. After finishing stripping the portion of the STI oxide 221, a photoresist (PR) is stripped, and the ONO layer 234 is deposited via the process of CVD at 350° C. to 800° C.

Figure 6:
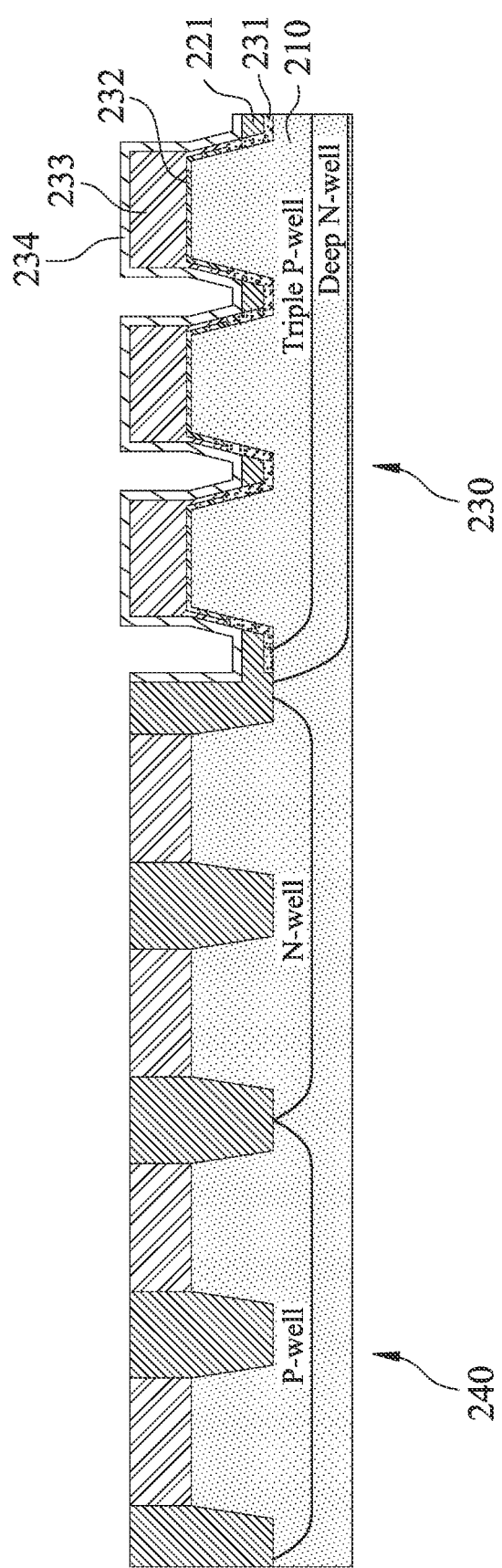
FIG. 6 is a schematic view of the removing step according to the embodiment of FIG. 1.

FIG. 6 is a schematic view of the removing step S105 according to the embodiment of FIG. 1. In FIGS. 1 and 6, a portion of the ONO layer 234 is removed in the non-memory cell area 240 of the memory structure.

Figure 7:
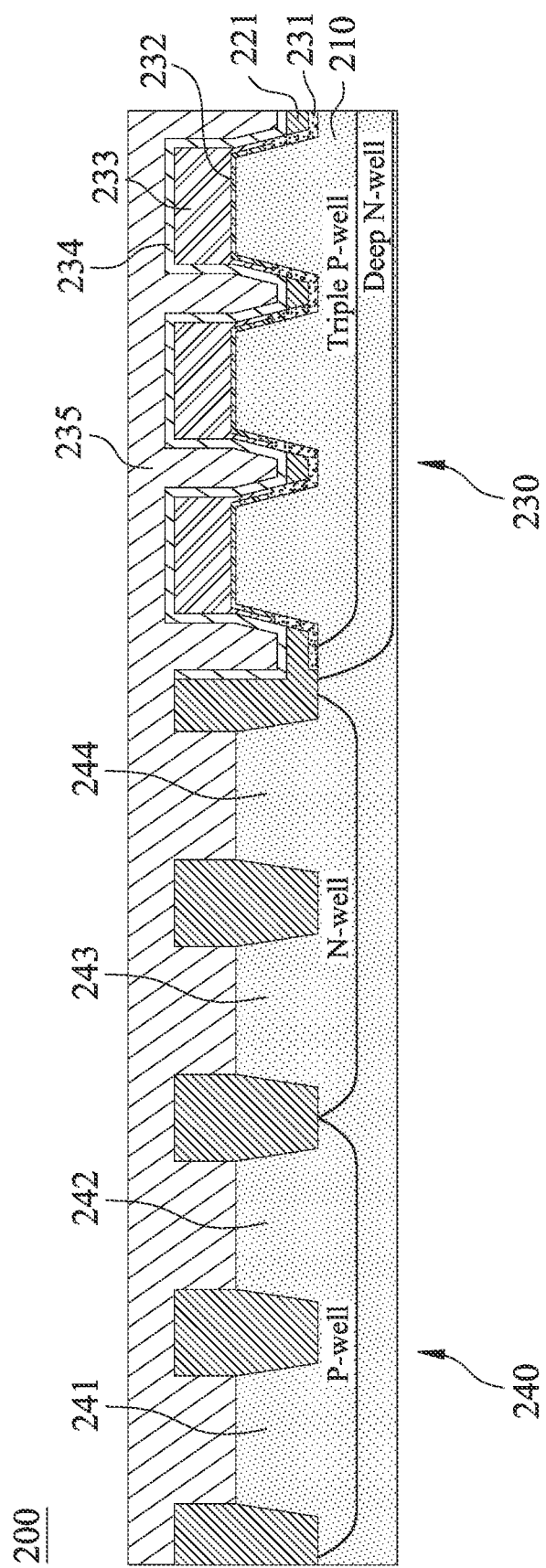
FIG. 7 is a schematic view of the CG structure forming step according to the embodiment of FIG. 1.
Figure 8:
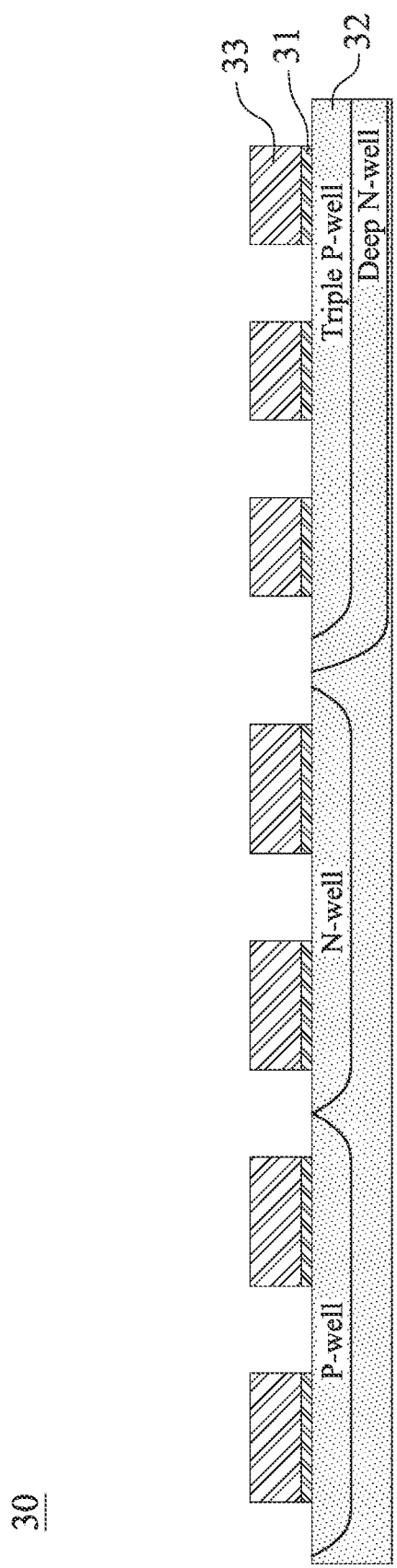
FIG. 8 is a schematic view of a structure of a stack of $Si_3N_4/SiO_2$/silicon of prior art.

FIG. 7 is a schematic view of the CG structure forming step S106 according to the embodiment of FIG. 1. In FIGS. 1 and 7, a portion of the FG structure 233 is removed in the non-memory cell area 240 of the memory structure, a second polysilicon is disposed on a surface of the ONO layer 234 in the memory cell area 230 and on the surface of the substrate 210 and a surface of the STI oxide 221 in the non-memory cell area 240 of the memory structure to form a CG structure 235, and the FinFET stack gate memory 200 is formed.

In FIGS. 6 and 7, the mask is applied for covering the memory cell area 230, and the ONO layer 234 and the FG structure 233 are removed via the etching process in the non-memory cell area 240 for reserving for a plurality of peripheral devices. Furthermore, source/drain junctions for the memory cell area 230 and the peripheral devices are formed, and contact/metal connections are formed to allow proper electric connections.

Via the method of forming the FinFET stack gate memory of the present disclosure, a channel width of a scaling barrier scaling below 120 nm can be maintained, and an effective channel width can be widen. Moreover, it is favorable for avoiding significant current loss and reliability issue, and also maintaining proper cell current. Further, a scaling limitation can be decreased, and a density of the FinFET stack gate memory can be increased.

In FIG. 7, the FinFET stack gate memory 200 of the present disclosure includes the substrate 210, the STI structure 220, the memory cell area 230 and the non-memory cell area 240.

In detail, the STI structure 220 is disposed on the substrate 210, and includes the STI oxide 221. The STI oxide 221 is disposed in the STI structure 220, the STI oxide 221 can be made of silicon oxide, and a thickness of the STI oxide 221 can be 600 Å to 2400 Å.

The memory cell area 230 includes the nitride film 231, the tunnel oxide 232, the FG structure 233, the ONO layer 234 and the CG structure 235. The nitride film 231 is disposed on a surface of the STI structure 220 and below the surface of the substrate 210. The tunnel oxide 232 is disposed on the substrate 210, the tunnel oxide 232 can be made of silicon oxide, and a thickness of the tunnel oxide 232 can be 70 Å to 105 Å. It is worth mentioning that the best thickness of the tunnel oxide 232 is 95 Å, but is not limited thereto. The FG structure 233 is disposed on the tunnel oxide 232. The ONO layer 234 is disposed on the FG structure 233 and the STI oxide 221, and the STI oxide 221 is located between the ONO layer 234 and the nitride film 231. The CG structure 235 is disposed on the ONO layer 234, and the ONO layer 234 is located between the FG structure 233 and the CG structure 235. Furthermore, a thickness of the FG structure 233 is 1000 Å, a thickness of the ONO layer 234 is 65/80/65 Å, and a thickness of the CG structure 235 is 2000 Å, but is not limited thereto.

In detail, the ONO layer 234 can be made of silicon oxide/silicon nitride/silicon oxide. Also, silicon nitride can be replaced with high-k insulator materials like alumina, zirconia, hafnia, titania or strontium titanate. Hence, the ONO layer 234 can also be made of silicon oxide/alumina/silicon oxide, silicon oxide/zirconia/silicon oxide, silicon oxide/hafnia/silicon oxide, silicon oxide/titania/silicon oxide or silicon oxide/strontium titanate/silicon oxide, but is not limited thereto.

The non-memory cell area 240 is connected to the memory cell area 230, and includes the plurality of peripheral devices. Moreover, the memory cell area 230 is isolated from the non-memory cell area 240, and a short circuit will not be caused. In detail, the peripheral devices includes a high voltage N-channel (HVN) logic device 241, a low voltage N-channel (LVN) logic device 242, a high voltage P-channel (HVP) logic device 243 and a low voltage P-channel (LVP) logic device 244.

Furthermore, a triple P-well (its reference numeral is omitted) is located on a deep N-well (its reference numeral is omitted) of the substrate 210 in the memory cell area 230, and a P-well (its reference numeral is omitted) is located beside an N-well (its reference numeral is omitted) of the substrate 210 in the non-memory cell area 240.

Via the FinFET stack gate memory of the present disclosure, an effective memory cell channel width is increased, a further memory cell size scaling can be allowed, and a current of the FinFET stack gate memory can be kept intact.

The foregoing description, for purpose of explanation, has been described with reference to specific embodiments. It is to be noted that Tables show different data of the different embodiments; however, the data of the different embodiments are obtained from experiments. The embodiments were chosen and described in order to best explain the principles of the disclosure and its practical applications, to thereby enable others skilled in the art to best utilize the disclosure and various embodiments with various modifications as are suited to the particular use contemplated. The embodiments depicted above and the appended drawings are exemplary and are not intended to be exhaustive or to limit the scope of the present disclosure to the precise forms disclosed. Many modifications and variations are possible in view of the above teachings.

What is claimed is:

1. A method of forming a FinFET stack gate memory, comprising:
   a nitride film forming step, wherein a nitride film is formed on a memory cell area of a memory structure with a shallow trench isolation (STI) structure;
   a stripping step, wherein a portion of the nitride film is stripped, the other portion of the nitride film which is unstripped is below a surface of a substrate and is remained at a bottom of the STI structure, and a STI oxide is disposed in the STI structure;
   a floating gate (FG) structure forming step, wherein a tunnel oxide is disposed on the surface of the substrate and a surface of the other portion of the nitride film, and a first polysilicon is disposed on the tunnel oxide in the memory cell area and on the surface of the substrate in a non-memory cell area of the memory structure to form a FG structure;
   an oxide-nitride-oxide (ONO) layer disposing step, wherein a portion of the STI oxide is stripped, and an ONO layer is disposed on a surface of the FG structure, the surface of the other portion of the nitride film, and a surface of the other portion of the STI oxide which is unstripped after the portion of the STI oxide is stripped in the memory cell area;
   a removing step, wherein a portion of the ONO layer is removed in the non-memory cell area of the memory structure; and
   a control gate (CG) structure forming step, wherein a portion of the FG structure is removed in the non-memory cell area of the memory structure, a second polysilicon is disposed on a surface of the ONO layer in the memory cell area and on the surface of the substrate and a surface of the STI oxide in the non-memory cell area of the memory structure to form a CG structure, and the FinFET stack gate memory is formed;
   wherein the tunnel oxide is directly connected to and overlaps the surface of the substrate and the surface of the other portion of the nitride film to form a Fin-shaped structure.

2. The method of forming the FinFET stack gate memory of claim 1, wherein the nitride film is made of a silicon nitride.

3. The method of forming the FinFET stack gate memory of claim 1, wherein the substrate is made of a silicon.

4. The method of forming the FinFET stack gate memory of claim 1, wherein the portion of the nitride film is stripped to a thickness of 300 Å to 1400 Å in the stripping step.

5. The method of forming the FinFET stack gate memory of claim 1, wherein the portion of the STI oxide is stripped via a solution containing a hydrofluoric acid in the ONO layer disposing step.

6. The method of forming the FinFET stack gate memory of claim 1, wherein a portion of the FG structure is removed by an etching process before the CG structure forming step.

7. The method of forming the FinFET stack gate memory of claim 1, wherein the nitride film in the non-memory cell area of the memory structure is removed by an etching process in the nitride film forming step.

8. The method of forming the FinFET stack gate memory of claim 1, wherein the STI oxide is disposed in the STI structure via a process of chemical vapor deposition (CVD) in the stripping step.

9. The method of forming the FinFET stack gate memory of claim 1, wherein the FG structure is formed via a chemical-mechanical polishing (CMP) to form a FIN-shaped FG structure in the FG structure forming step.

* * * * *